United States Patent
Vepsäläinen et al.

(10) Patent No.: US 7,519,336 B2
(45) Date of Patent: Apr. 14, 2009

(54) METHOD AND ARRANGEMENT FOR OPTIMIZING EFFICIENCY OF A POWER AMPLIFIER

(75) Inventors: Jussi Vepsäläinen, Helsinki (FI); Jorma Matero, Oulu (FI)

(73) Assignee: Nokia Corporation, Espoo (FI)

( * ) Notice: Subject to any disclaimer, the term of this patent is extended or adjusted under 35 U.S.C. 154(b) by 516 days.

(21) Appl. No.: 11/418,831

(22) Filed: May 5, 2006

(65) Prior Publication Data

US 2007/0258602 A1 Nov. 8, 2007

(51) Int. Cl.
*H04B 1/04* (2006.01)
(52) U.S. Cl. .................................. 455/127.1; 339/136
(58) Field of Classification Search ............. 455/115.1, 455/127.1, 127.5, 522; 330/10, 129, 136, 330/296, 297; 375/297
See application file for complete search history.

(56) References Cited

U.S. PATENT DOCUMENTS

| | | | | |
|---|---|---|---|---|
| 4,831,334 | A * | 5/1989 | Hudspeth et al. ............... | 330/10 |
| 6,714,071 | B1 * | 3/2004 | Page ........................... | 330/136 |
| 6,725,021 | B1 | 4/2004 | Anderson et al. | |
| 6,975,166 | B2 | 12/2005 | Grillo et al. | |
| 7,092,683 | B2 * | 8/2006 | Tanaka et al. ................ | 455/108 |
| 7,440,733 | B2 * | 10/2008 | Maslennikov et al. .... | 455/114.3 |
| 2003/0198300 | A1 | 10/2003 | Matero et al. | |
| 2005/0110562 | A1 | 5/2005 | Robinson et al. | |
| 2007/0249304 | A1 * | 10/2007 | Snelgrove et al. ......... | 455/127.2 |
| 2008/0146171 | A1 * | 6/2008 | Hellberg et al. ............. | 455/110 |

OTHER PUBLICATIONS

F. Wang, et al; "Design of wide-bandwidth envelope-tracking power amplifiers for OFDM applications;" IEEE Transactions On Microwave Theory and Techniques; vol. 53, No. 4; Apr. 2005; pp. 1244-1255.

* cited by examiner

*Primary Examiner*—Blane J Jackson
(74) *Attorney, Agent, or Firm*—Alfred A. Fressola; Ware, Fressola, Van Der Sluys & Adolphson LLP

(57) ABSTRACT

The invention relates to optimizing efficiency of a power amplifier of a transmitter. In a solution according to the invention a detected envelope (306) of an input signal of the power amplifier is filtered with a non-linear filter (307) that substantially preserves a rise time of a peak in a waveform of the envelope but lengthens a temporal duration of the peak. A filtered envelope is used as an input quantity (308) for a control system that controls a supply voltage of the power amplifier. For the control system it is easier to react to peaks of the filtered envelope than to the peaks of the envelope because the temporal duration of the peaks of the filtered envelope is longer than that of the peaks of the envelope.

22 Claims, 9 Drawing Sheets

METHOD AND ARRANGEMENT FOR OPTIMIZING EFFICIENCY OF A POWER AMPLIFIER

FIELD OF THE INVENTION

The invention relates to a transmitter for communicating devices. The invention especially relates to optimizing efficiency of a power amplifier of a transmitter.

BACKGROUND OF THE INVENTION

In order to optimize efficiency of a power amplifier one needs to keep a supply voltage of the power amplifier as low as possible; in this document the efficiency means: output signal power/(input signal power+energizing power of the power amplifier). On the other hand the supply voltage has to be high enough that no clipping occurs in an output signal of the power amplifier. In an envelope tracking power amplifier an envelope of an input signal of the amplifier is detected and the supply voltage is a function of the detected value of the envelope. The power amplifier operates close to a compression point on all envelope values and thus provides a good efficiency. Keeping the supply voltage at an optimal value is a challenging task especially when the output signal of the power amplifier has a high peak to average ratio. A value of the supply voltage has to be able to follow variations in the value of the envelope so closely that no clipping occurs and, on the other hand, efficiency of the power amplifier is sufficiently good. In order to fulfil this requirement a controllable voltage source that produces the supply voltage has to have a sufficiently high bandwidth. High bandwidth of the controllable voltage source means, however, high power losses in the controllable voltage source. For example, in a case of a switched mode power supply (SMPS) as the controllable voltage source a switching frequency has to be increased when the bandwidth is increased. Increasing the switching frequency increases switching losses. A simple solution for taking quick variations in the envelope into account is to keep the value of the supply voltage so high that there is a sufficient safety margin in different situations. This kind of approach leads, however, to a situation in which the supply voltage is unnecessarily high over a significant portion of time. Too high a supply voltage means unnecessary power losses especially in output stage transistors of a power amplifier.

DESCRIPTION OF THE PRIOR ART

FIG. 1 shows a high-level block diagram of an envelope tracking power amplifier according to prior art. An envelope of an input signal S_in is detected with an envelope detector 103. The value of the envelope is scaled to an appropriate range with a gain unit 104. An output signal of the gain unit 104 is forced to a range between a predetermined minimum Min_V and a predetermined maximum Max_V with a maximum selector unit 108 and a minimum selector unit 109. An output signal of the minimum selector unit 109 is a control value Vc that controls a controllable supply unit 107 that produces a supply voltage Vs for an amplifier stage 101. A load of the amplifier stage 101 is represented by an impedance 102. A gain unit 105 is disposed to scale the input signal S_in to an appropriate range. There is always a delay from a change in the envelope to a corresponding change in the supply voltage Vs. This is due to the fact that bandwidths of the envelope detector 103, the gain unit 104, the maximum selector unit 108, the minimum selector unit 109, and the controllable supply unit 107 are limited. A common effect of the bandwidths constitutes a control bandwidth of the supply voltage. The envelope detector 103, the gain unit 104, the maximum selector unit 108, the minimum selector unit 109, and the controllable supply unit 107 constitute a control system 110 of the supply voltage Vs. In order to compensate the effect of the above-mentioned delay the input signal S_in is delayed with a delay unit 106. In this example the controllable supply unit is a switched mode power supply (SMPS) that is energized with dc-voltage Vbatt.

FIG. 2 illustrates exemplary waveforms of the input signal S_in, the envelope of the input signal, and a value of the supply voltage Vs as functions of time for two different cases corresponding with different control bandwidths of the supply voltage. In both of the cases a curve 201 represents the input signal S_in and a curve 202 represents the envelope of the input signal S_in. The curve 201 is drawn only for a part of a time axis but the input signal S_in extends over the whole time axis shown in FIG. 2. In the first case the control bandwidth of the supply voltage is narrower than that in the second case. In the first case a curve 203 represents the supply voltage Vc and a dashed line 204 represents a time average of the supply voltage. In the second case a curve 205 represents the supply voltage Vc and a dashed line 206 represents a time average of the supply voltage. In these exemplary cases a peak-to-RMS ratio (Root Mean Square) of the input signal 201 is quite high. The time averages 204 and 206 have to be selected in a way that the supply voltages 203 and 205 are all the time sufficiently above the envelope 202. When a delay produced by the delay unit 106 in FIG. 1 is altered the curves 201 and 202 representing the input signal and its envelope are moved in a horizontal direction in FIG. 2. The delay has to be adjusted in a way that the curve 202 representing the envelope does not intersect the curve 203 or 205 representing the supply voltage Vc. As can be seen from FIG. 2 the time average of the supply voltage can be made lower when the control bandwidth is greater. A Low value of the time average of the supply voltage Vc means good efficiency of the amplifier stage 101 in FIG. 1. On the other hand, accuracy of the delay adjustment needs to be better when the control bandwidth is greater. High accuracy required in the delay adjustment means a complex implementation and a slow calibration process of the amplifier. Furthermore a high value of the control bandwidth means high power losses in the controllable power supply 107 in FIG. 1. A situation is especially disadvantageous when the envelope 202 has a low time average and high sharp peaks. In this kind of case the time average of the supply voltage Vs should be kept low in order to reach an acceptable efficiency of the amplifier but the control system of the supply voltage 110 in FIG. 1 has to be able to react to the high sharp peaks of the envelope, i.e. the control bandwidth has to be sufficiently high.

BRIEF DESCRIPTION OF THE INVENTION

It is an objective of the present invention to provide an envelope tracking power amplifier the efficiency of which can be optimized so that the limitations and drawbacks associated with prior art are eliminated or reduced. It is also an object of the present invention to provide a mobile communication device having an envelope tracking power amplifier the efficiency of which can be optimized so that the limitations and drawbacks associated with prior art are eliminated or reduced. It is also an object of the present invention to provide a method for optimizing efficiency of an envelope tracking power amplifier so that the limitations and drawbacks associated with prior art are eliminated or reduced. It is also an object of the present invention to provide a transmitter that can be used e.g. in a mobile communication device so that the limitations and drawbacks associated with prior art are eliminated or reduced.

The objectives of the invention are achieved with a solution in which an envelope signal that represents a detected envelope of an input signal of a power amplifier is filtered with a non-linear filter that substantially preserves a rise time of a peak in a waveform of the envelope signal but lengthens a temporal duration of said peak. A filtered envelope signal is used as an input signal of a control system that controls a value of a supply voltage. For the control system it is easier to react to peaks of the filtered envelope signal than to the peaks of the envelope signal because the temporal duration of the peaks of the filtered envelope signal is longer than that of the peaks of the envelope signal.

The invention yields appreciable benefits compared to prior art solutions:

- power losses in a power amplifier are reduced since efficiency of an amplifier stage that corresponds with a certain control bandwidth is improved and, on the other hand, a lower control bandwidth can be used and better efficiency of a power supply unit can be reached without sacrificing the efficiency of the amplifier stage, therefore, temperature of electrical components of the power amplifier is reduced, and
- calibration of a delay unit of the power amplifier, i.e. adjusting timing between a supply voltage and an envelope of an input signal of the amplifier stage, is faster and easier because a temporal duration of a peak in a waveform of the above-described filtered envelope signal is longer than that of a corresponding peak in a waveform of the envelope.

In a case of a switched mode power supply (SMPS) unit a switching frequency can be reduced and thus a better efficiency of the power supply unit can be reached without sacrificing the efficiency of the amplifier stage. In a battery energized mobile communication device reduction of power losses means an increase in an operation time between successive battery chargings.

An envelope tracking power amplifier according to the invention having an amplifier stage is characterized in that the envelope tracking power amplifier comprises:

- an envelope detector disposed to produce an envelope signal that represents an envelope of an input signal of the envelope tracking power amplifier,
- a non-linear filter disposed to filter the envelope signal so that a rise time of a peak in a waveform of the envelope signal is substantially preserved and a temporal duration of said peak is lengthened, said filter producing a filtered envelope signal, and
- a controllable supply unit disposed to determine a value of a supply voltage at least partly according to said filtered envelope signal and to produce the supply voltage for energizing the amplifier stage.

A mobile communication device according to the invention is characterized in that it comprises:

- an envelope tracking power amplifier having an amplifier stage,
- an envelope detector disposed to produce an envelope signal that represents an envelope of an input signal of the envelope tracking power amplifier,
- a non-linear filter disposed to filter the envelope signal so that a rise time of a peak in a waveform of the envelope signal is substantially preserved and a temporal duration of said peak is lengthened, said filter producing a filtered envelope signal, and
- a controllable supply unit disposed to determine a value of a supply voltage at least partly according to said filtered envelope signal and to produce the supply voltage for energizing the amplifier stage.

A method according to the invention for optimizing efficiency of an envelope tracking power amplifier having an amplifier stage is characterized in that the method comprises:

- detecting an envelope signal that represents an envelope of an input signal of the envelope tracking power amplifier,
- producing a filtered envelope signal by filtering the envelope signal with a non-linear filter that substantially preserves a rise time of a peak in a waveform of the envelope signal and lengthens a temporal duration of said peak,
- determining a supply voltage value at least partly according to said filtered envelope signal, and
- setting a supply voltage of the amplifier stage to be the supply voltage value.

A transmitter according to the invention is characterized in that it comprises:

- a base band stage disposed to produce a base band signal and an up-modulator disposed to up-modulate the base band signal,
- a power amplifier having an amplifier stage, an input signal of the amplifier stage being substantially an output signal of the up-modulator,
- an envelope detector disposed to detect from the base band signal an envelope signal that represents an envelope of the input signal of the amplifier stage,
- a non-linear filter disposed to filter the envelope signal so that a rise time of a peak in a waveform of the envelope signal is substantially preserved and a temporal duration of said peak is lengthened, said filter producing a filtered envelope signal, and
- a controllable supply unit disposed to determine a value of a supply voltage at least partly according to said filtered envelope signal and to produce the supply voltage for energizing the amplifier stage.

Features of various advantageous embodiments of the invention are described below.

The exemplary embodiments of the invention presented in this document are not to be interpreted to pose limitations to the applicability of the appended claims. The verb "to comprise" is used in this document as an open limitation that does not exclude the existence of also unrecited features. The features recited in depending claims are mutually freely combinable unless otherwise explicitly stated.

BRIEF DESCRIPTION OF THE FIGURES

The invention and its other advantages are explained in greater detail below with reference to the preferred embodiments presented in the sense of examples and with reference to the accompanying drawings, in which.

DETAILED DESCRIPTION OF THE PREFERRED EMBODIMENTS OF THE INVENTION

Figure 1:
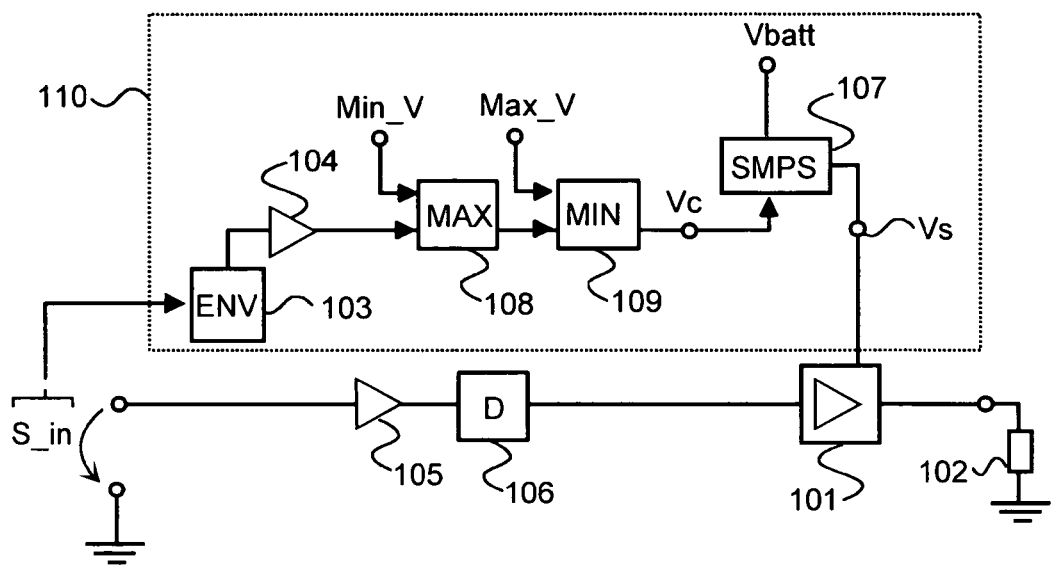
FIG. 1 shows a high-level block diagram of an envelope tracking power amplifier according to prior art.
Figure 2:
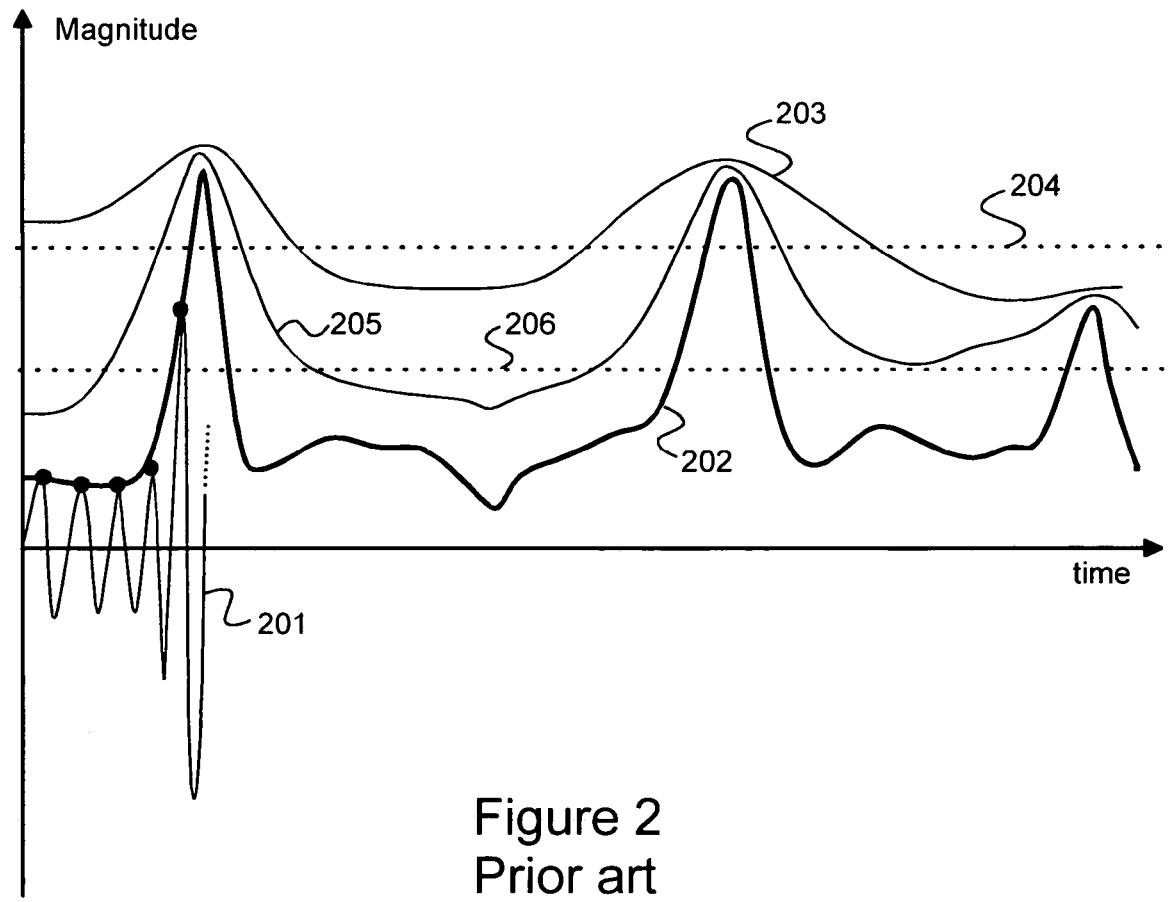
FIG. 2 shows exemplary waveforms of an input signal, an envelope of said input signal, and supply voltages of an envelope tracking power amplifier according to prior art.

FIGS. 1-2 have been explained above in the description of the prior art.

Figure 3:
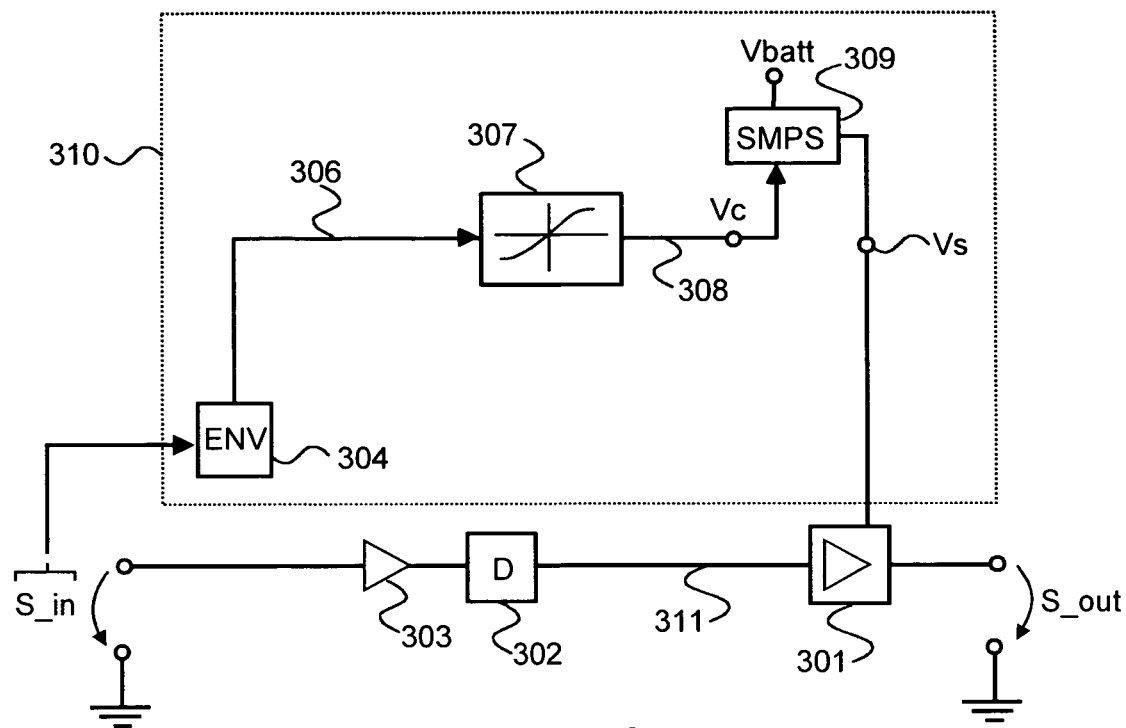
FIG. 3 shows a high-level block diagram of an envelope tracking power amplifier according to an embodiment of the invention.

FIG. 3 shows a high-level block diagram of an envelope tracking power amplifier according to an embodiment of the invention. An envelope signal 306 representing an envelope of an input signal S_in is detected with an envelope detector 304. From the viewpoint of the principle of operation it is immaterial whether the envelope is detected from the input signal S_in or from some other signal from which information associated with the envelope can be extracted. In many applications the input signal S_in is produced with a base band stage and an up-modulator; the base band stage and the up-modulator are not shown in FIG. 3. In these applications it is possible to detect the envelope from the base band signal.

The envelope signal 306 is filtered with a non-linear filter 307 that produces a filtered envelope signal 308. The non-linear filter 307 is disposed to filter the envelope signal 306 so that a rise time of a peak in a waveform of the envelope signal is substantially preserved and a temporal duration of said peak is lengthened. The filtered envelope signal 308 is used as a control value Vc that controls a controllable supply unit 309 that produces a supply voltage Vs for an amplifier stage 301. An output signal of the amplifier stage 301 is denoted with S_out. A gain unit 303 is disposed to scale the input signal S_in to an appropriate range. There is always a delay from a change in the envelope of S_in to a corresponding change in the supply voltage Vs. This is due to the fact that bandwidths of the envelope detector 304, the non-linear filter 307, and the controllable supply unit 309 are limited. A common effect of the bandwidths constitutes a control bandwidth of the supply voltage. The envelope detector 304, the non-linear filter 307, and the controllable supply unit 309 constitute a control system 310 of the supply voltage Vs. In order to compensate the effect of the above-mentioned delay the input signal S_in is delayed with a delay unit 302.

In this embodiment of the invention the controllable supply unit 309 is a switched mode power supply (SMPS) that is energized with a dc-voltage Vbatt. In an alternative embodiment of the invention the controllable supply unit 309 is a linear regulator.

In an envelope tracking power amplifier according to an embodiment of the invention the supply voltage Vc is determined according to the filtered envelope signal 308 and control parameters of the controllable supply unit 309. The control parameters can, for example, determine a minimum supply voltage and/or a maximum supply voltage, i.e. the limits between which the supply voltage is controlled.

Figure 4:
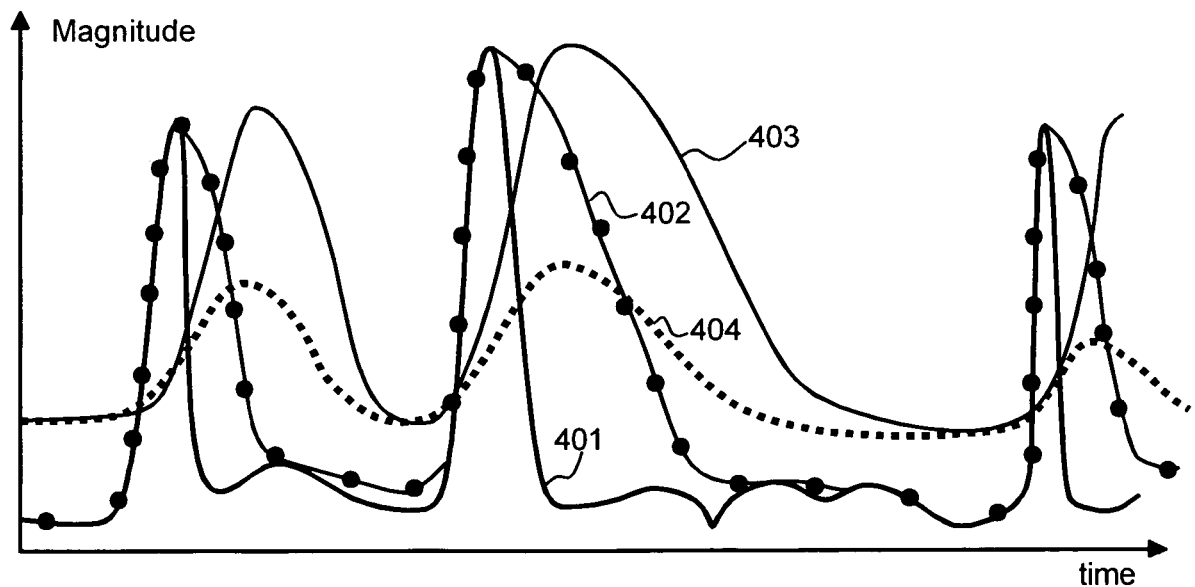
FIG. 4 shows exemplary waveforms that illustrate an operating principle of an envelope tracking power amplifier according to an embodiment of the invention.

Exemplary waveforms shown in FIG. 4 are used for illustrating the operation principle of the envelope tracking power amplifier shown in FIG. 3. A curve 401 represents the envelope signal 306. A curve 402 represents the filtered envelope signal 308. The filtered envelope signal is marked with black circles in FIG. 4. A rise time of a peak in a waveform of the envelope signal 401 is substantially preserved when the envelope signal is filtered with the non-linear filter 307. In FIG. 4 this behaviour is illustrated by the fact that the filtered envelope signal 402 coincides with the envelope signal 401 on rising edges of peaks in the envelope signal 401. A temporal duration of a peak in the envelope signal 401 is lengthened when the envelope signal is filtered with the non-linear filter 307. This behaviour is also presented in FIG. 4. A curve 403 represents a waveform of the supply voltage Vs. The waveform of the supply voltage is a low-pass filtered version of the filtered envelope signal 402. The supply voltage Vs as a function of time is obtained from the curve 403 with an appropriate level offset. The low-pass filtering is due to the fact that the bandwidth of the controllable supply unit 309 is limited. As can be seen from FIG. 4 the low-pass filtering causes that local maximums in the curve 403 do not occur simultaneously with local maximums in the envelope signal 401. The delay unit 302 is adjusted in a way that local maximums in an envelope of a delayed signal 311 are sufficiently simultaneous with local maximums in the waveform of the supply voltage Vs. The level offset that is applied to curve 403 in order to obtain the supply voltage Vs is chosen to be such that the supply voltage is always above the envelope of the delayed signal 311 with a sufficient safety margin.

In the text below we compare a case in which the non-linear filter 307 is used with a case in which the non-linear filter is not used. A curve 404 (dashed line) is associated with the case in which the non-linear filter is not used and it represents a low-pass filtered version of the envelope signal 401. The low-pass filtering is due to the fact that the bandwidth of the controllable supply unit 309 is limited. A supply voltage corresponding with the case in which the envelope signal is not filtered with the non-linear filter 307 is obtained from the curve 404 with an appropriate level offset. From FIG. 4 it can be seen that a level offset needed for the curve 404 is significantly greater than the level offset needed for the curve 403. Therefore, a time average of a supply voltage is significantly greater in the case in which the non-linear filter 307 is not used than a corresponding time average in a case in which the non-linear filter 307 is used. Higher time average of the supply voltage Vs means higher power losses in the amplifier stage 301.

Figure 5:
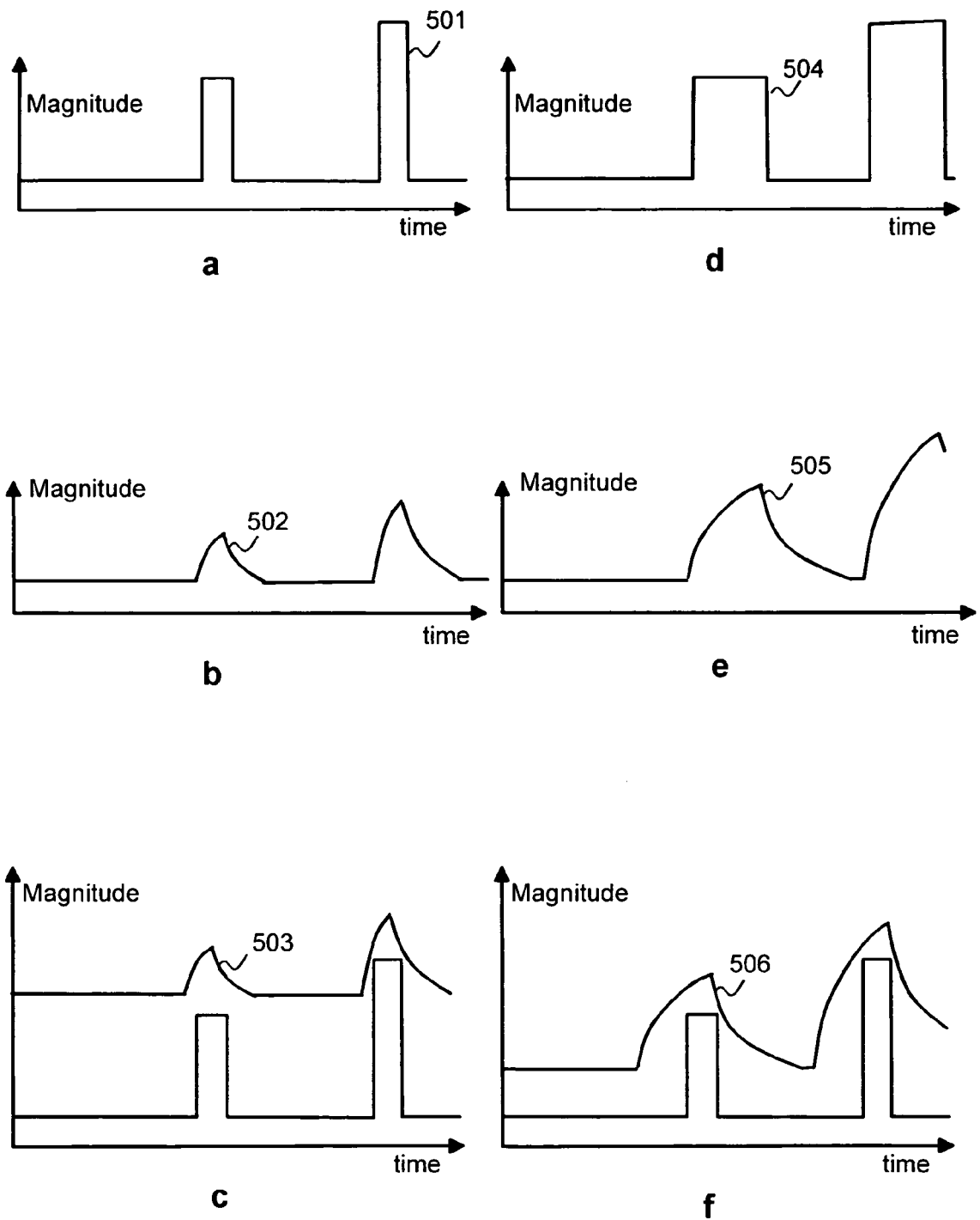
FIGS. 5a-5f illustrate a principle of using a non-linear filter in an envelope tracking power amplifier according to an embodiment of the invention.

FIGS. 5a-5f illustrate a principle of using a non-linear filter that is disposed to substantially preserve a rise time of a peak in a waveform of an envelope signal and to lengthen a temporal duration of said peak. In the examples shown in FIGS. 5a-5f a waveform of the envelope signal and a transfer function of a low-pass effect of a controllable supply unit are, for the sake of illustrative purposes, chosen to be so simple that operation can be analysed without simulations and/or measurements. In this example case the transfer function of the controllable power supply is assumed to be a first order linear low-pass function having a single time constant. The envelope signal 501 is shown in FIG. 5a. A low-pass filtered version 502 of the envelope signal 501 is shown in FIG. 5b. A waveform of the low-pass filtered version of the envelope signal corresponds with a waveform of the supply voltage when a non-linear filtering according to an embodiment of the invention is not used. FIG. 5c shows the supply voltage 503 that is a level and time shifted version of the low-pass filtered version of the envelope signal. FIG. 5d shows a filtered envelope signal 504 that is produced with a non-linear filter disposed to substantially preserve a rise time of a peak in a waveform of the envelope signal and to lengthen a temporal duration of said peak. A low-pass filtered version 505 of the filtered envelope signal 504 is shown in FIG. 5e. A waveform of the low-pass filtered version of the filtered envelope signal corresponds with a waveform of the supply voltage when a non-linear filtering is used according to an embodiment of the invention. FIG. 5f shows the supply voltage 506 that is a level and time shifted version of the low-pass filtered version of the envelope signal. As clearly illustrated in FIGS. 5c and 5f a time average of the supply voltage 506 is lower than that of the supply voltage 503.

Figure 6:
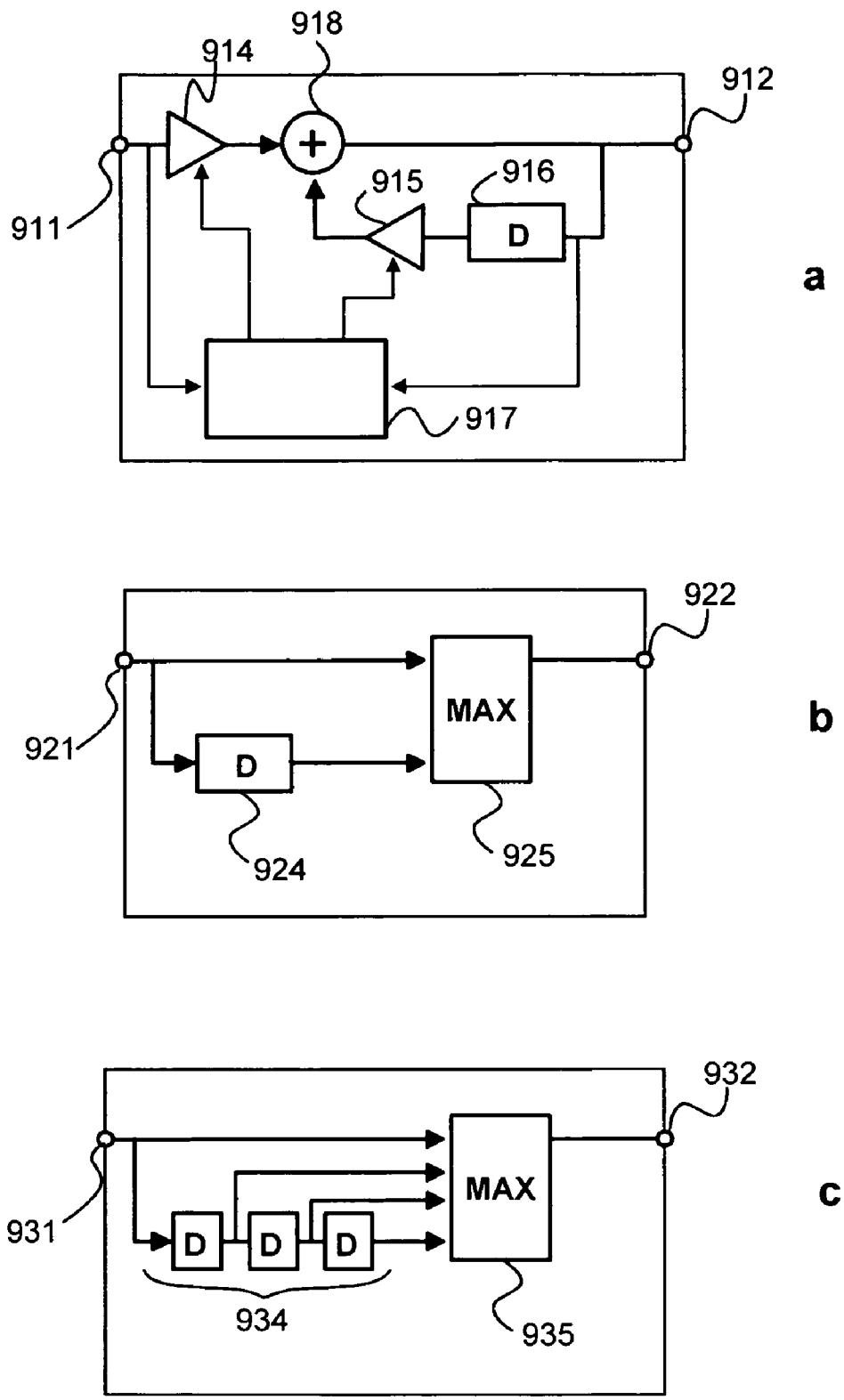
FIGS. 6a-6c show non-linear filters used in envelope tracking power amplifiers according to embodiments of the invention.

FIG. 6a shows a digital non-linear filter used in an envelope tracking power amplifier according to an embodiment of the invention. The non-linear filter comprises a signal input terminal 911 and a signal output terminal 912. The non-linear filter comprises adjustable gain units 914 and 915, an adder 918, a delay unit 916, and a control unit 917. A transfer function of the non-linear filter is $$F(z) = \frac{a}{1 - bz^{-1}}, \quad (1)$$

where a is a gain of the adjustable gain unit 914, b is a gain of the adjustable gain unit 915, and $z^{-1}$ denotes a delay of the delay unit 916. The control unit 917 is adapted to set the gains a and b according to a value of an input signal of the non-linear filter and a value of an output signal of the non-linear filter. Preferably, the gains a and b are selected such that the transfer function is unity (i.e. a=1 and b=0) when the value of the input signal is greater than the value of the output signal and that the transfer function represents a low-pass filter (i.e. 0<b<1 and a=1−b) when the value of the input signal is less than the value of the output signal.

Figure 7:
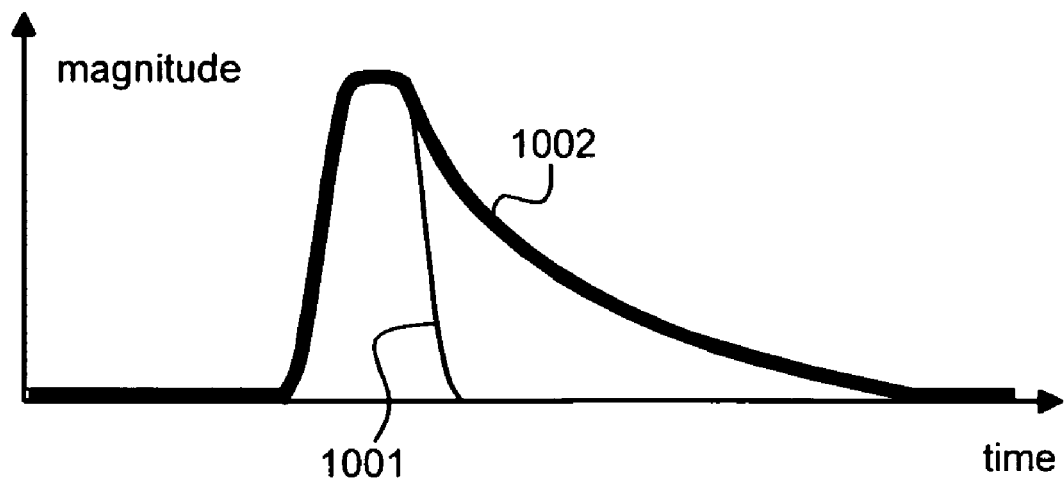
FIGS. 7 and 8 illustrate operation of the non-linear filters shown in FIGS. 6a-6c.

Operation of the non-linear filter shown in FIG. 6a is illustrated in FIG. 7 for a single peak in a waveform of the input signal 1001 (thin line). On the rising edge of the input signal 1001 the output signal 1002 (thick line) follows the input signal. After the rising edge the output signal is attenuated according to a damping radius that is the gain b. Therefore, the non-linear filter shown in FIG. 6a substantially preserves a rise time of a peak in the waveform of the input signal and lengthens a temporal duration of said peak.

FIG. 6b shows a digital non-linear filter used in an envelope tracking power amplifier according to an embodiment of the invention. The non-linear filter comprises a signal input terminal 921, a signal output terminal 922, a delay unit 924, and a maximum selection unit 925.

FIG. 6c shows a digital non-linear filter used in an envelope tracking power amplifier according to an embodiment of the invention. The non-linear filter comprises a signal input terminal 931, a signal output terminal 932, a chain of delay units 934, and a maximum selection unit 935.

Figure 8:
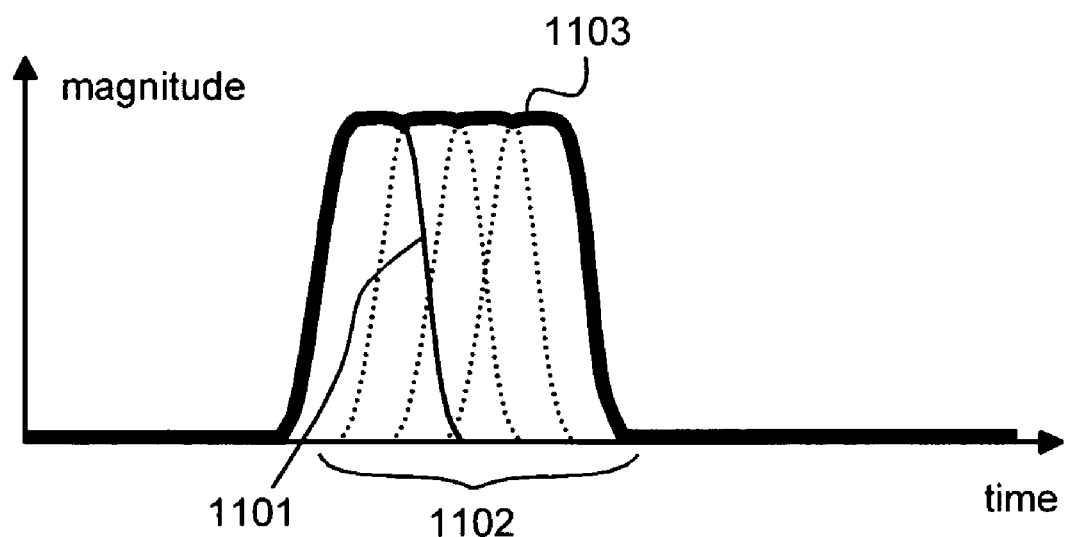

Operation of the non-linear filter shown in FIG. 6c is illustrated in FIG. 8 for a single peak in a waveform of an input signal (1101 thin line). An output signal 1103 (thick line) is produced with the maximum selection unit 935 that selects a maximum of the input signal 1101 and delayed versions 1102 (dashed line) of the input signal. The non-linear filter shown in FIG. 6b operates in a similar way. Therefore, the non-linear filters shown in FIGS. 6b and 6c substantially preserve a rise time of a peak in the waveform of the input signal and lengthen a temporal duration of said peak.

When a non-linear filter shown in FIG. 6a, 6b or 6c is used in the envelope tracking power amplifier shown in FIG. 3 the input signal of the non-liner filter is the envelope signal 306 and the output signal of the non-linear filter is the filtered envelope signal 308.

Figure 9:
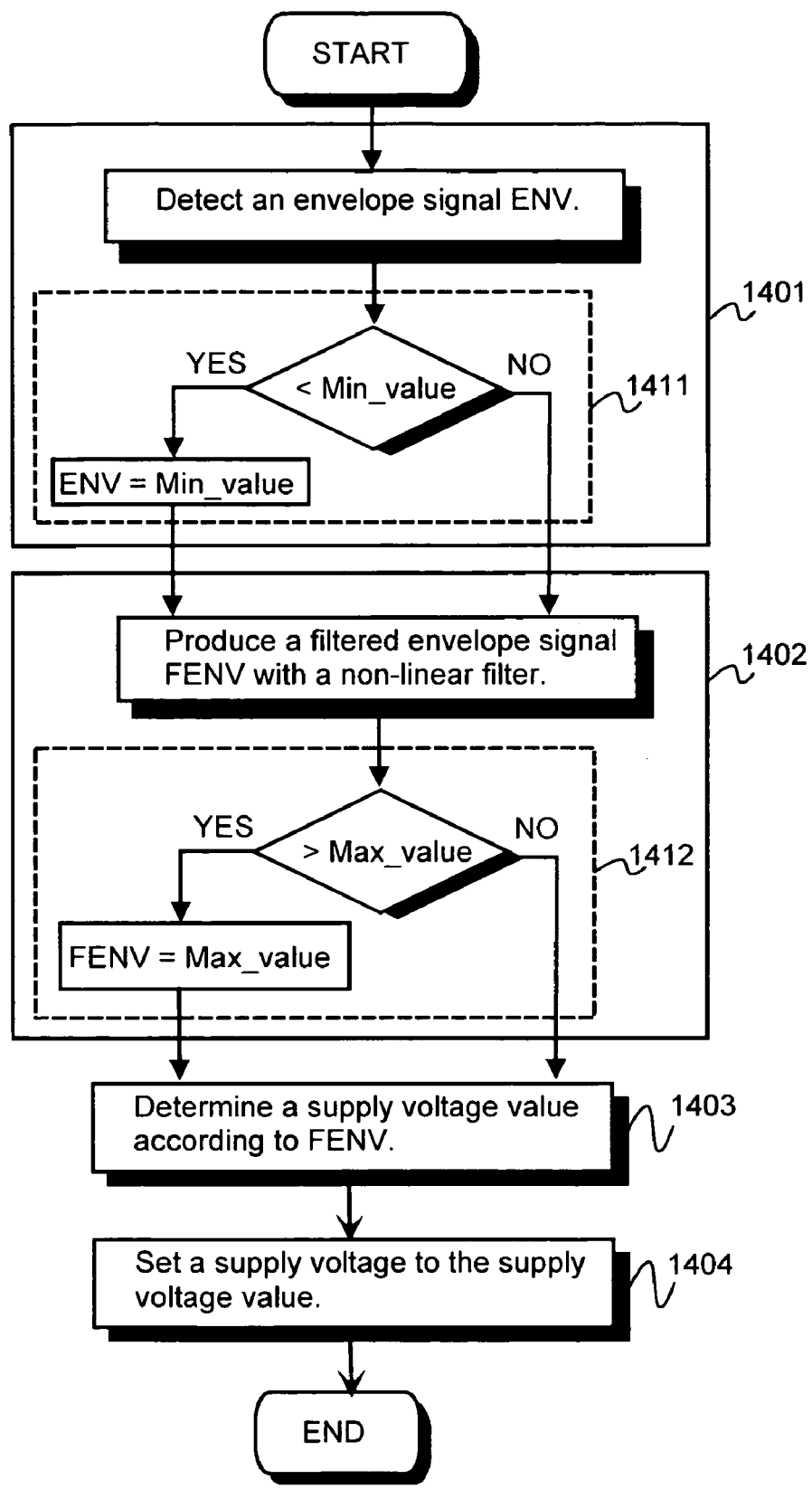
FIG. 9 shows a flow chart for a method according to an embodiment of the invention for optimizing efficiency of an envelope tracking power amplifier.

FIG. 9 shows a flow chart for a method according to an embodiment of the invention for optimizing efficiency of an envelope tracking power amplifier. A phase 1401 comprises detecting an envelope signal ENV that represents an envelope of an input signal of the envelope tracking power amplifier. A phase 1402 comprises producing a filtered envelope signal FENV by filtering the envelope signal ENV with a non-linear filter that substantially preserves a rise time of a peak in a waveform of the envelope signal and lengthens a temporal duration of said peak. A phase 1403 comprises determining a supply voltage value at least partly according to the filtered envelope signal FENV. A phase 1404 comprises setting a supply voltage of an amplifier stage of the envelope tracking power amplifier to be the supply voltage value determined in the phase 1403.

In a method according to an embodiment of the invention the detecting the envelope signal ENV, phase 1401, comprises forcing 1411 the envelope signal to be at least a predetermined minimum value Min_value and the producing the filtered envelope signal FENV, phase 1402, comprises forcing 1412 the filtered envelope signal to be at most a predetermined maximum value Max_value.

In a method according to an alternative embodiment of the invention the detecting the envelope signal ENV, phase 1401, comprises forcing the envelope signal to be at most a predetermined maximum value and the producing the filtered envelope signal FENV, phase 1402, comprises forcing the filtered envelope signal to be at least a predetermined minimum value.

In a method according to an alternative embodiment of the invention the detecting the envelope signal ENV, phase 1401, comprises forcing the envelope signal to be between a predetermined maximum value and a predetermined minimum value.

In a method according to an alternative embodiment of the invention the producing the filtered envelope signal FENV, phase 1402, comprises forcing the filtered envelope signal to be between a predetermined maximum value and a predetermined minimum value.

In a method according to an embodiment of the invention the producing the filtered envelope signal FENV, phase 1402, is performed by using a first transfer function when the envelope signal is greater than the filtered envelope signal (ENV>FENV) and a second transfer function when the envelope signal is smaller than the filtered envelope signal (ENV<FENV).

In a method according to an embodiment of the invention the producing the filtered envelope signal FENV, phase 1402, is performed by using a delay element that forms a delayed envelope signal and a maximum selection unit that forms the filtered envelope signal FENV as a maximum of the delayed envelope signal and the envelope signal.

Figure 10:
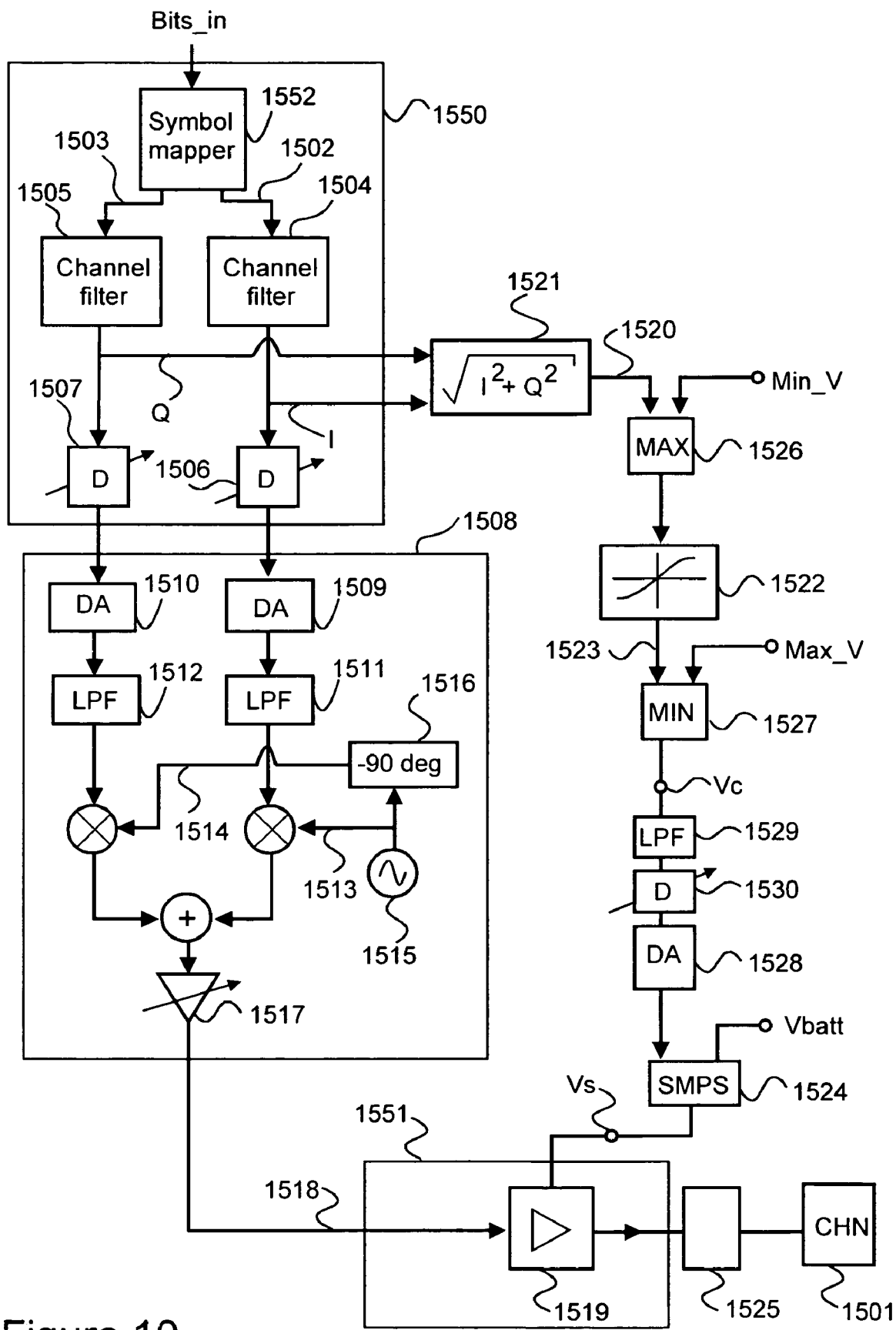
FIG. 10 shows a transmitter according to an embodiment of the invention.

FIG. 10 shows a transmitter according to an embodiment of the invention. The transmitter comprises a base band stage 1550, an up-modulator 1508, and a power amplifier 1551. The transmitter is adapted to send information of incoming bits Bits_in into a communication channel 1501. The communication channel can be a radio channel or a copper cable. The incoming bits Bits_in are mapped into symbols having an X-component 1502 and a Y-component 1503 with a bits-tosymbol mapper 1552. The X- and Y-components of the symbols are filtered with digital channel filters 1504 and 1505, respectively. The digital channel filters 1504 and 1504 produce a desired pulse form for the X- and Y-components of the symbols. The pulse form can be, for example, a square root raised cosine. Output signals of the digital channel filters 1504 and 1505 are a digital base band in-phase signal I and a digital base band quadrature signal Q, respectively. The digital channel filters 1504 and 1505 are also used for obtaining a desired sample rate for the digital base band in-phase and quadrature signals I and Q. A channel filter can be realized as a chain of digital filters so that one or more filters in the beginning of the chain are disposed to perform interpolation for increasing the sample rate and the last filter in the chain is disposed to perform pulse shaping. A mutual delay difference between the digital base band in-phase and quadrature signals I and Q can be adjusted with adjustable delay units 1506 and 1507. The digital base band in-phase and quadrature signals I and Q are input signals for the up-modulator 1508. The up-modulator is a QAM-modulator (Quadrature Amplitude Modulation) that is disposed to modulate the digital base band in-phase and quadrature signals I and Q up to a desired frequency band. The up-modulator comprises digital-to-analog converters 1509 and 1510 that are disposed to convert the digital base band in-phase and quadrature signals I and Q into analog form. Analog low-pass filters 1511 and 1512 are disposed to attenuate image spectra around multiples of the sample rate. An analog base band in-phase signal is mixed with an in-phase carrier tone 1513 and an analog base band quadrature signal is mixed with a quadrature carrier tone 1514. The in-phase and the quadrature carrier tones 1513 and 1514 are produced with a local oscillator 1515 and with a ninety-degrees phase shifter 1516. Mixed signal are added together and a level of the result is adjusted to an appropriate range with an adjustable gain unit 1517. An output signal of the adjustable gain unit 1517 is an input signal 1518 of an amplifier stage 1519 of the power amplifier 1551.

An envelope signal 1520 that represents an envelope of the input signal 1518 of the amplifier stage 1519 is produced with an envelope detector 1521. The envelope detector 1521 is a digital signal processing entity that is disposed to compute a value ENV of the envelope signal 1520 according to the digital base band in-phase signal I and the digital base band quadrature signal Q so that $$\mathrm{ENV} = \sqrt{I^2 + Q^2}. \qquad (2)$$

The envelope detector 1521 can be realized with a programmable processor or with a dedicated integrated circuit.

The envelope signal 1520 is filtered with a digital non-linear filter 1522 that produces a digital filtered envelope signal 1523. The non-linear filter 1522 is disposed to filter the envelope signal 1520 so that a rise time of a peak in a waveform of the envelope signal is substantially preserved and a temporal duration of said peak is lengthened. The digital non-linear filter 1522 can be a digital non-linear filter shown in FIG. 6a, 6b, or 6c.

The digital filtered envelope signal 1523 is substantially used as a control value Vc that controls a controllable supply unit 1524. The controllable supply unit produces a supply voltage Vs for the amplifier stage 1519. An output signal of the amplifier stage is coupled to the channel 1501 via a channel front-end circuit 1525. Depending on a type of the controllable supply unit 1524 the control value Vc may have to be converted into analog form with a digital-to-analog converter 1528.

A transmitter according to an embodiment of the invention comprises a maximum selector unit 1526 disposed to force the envelope signal 1520 to be at least a predetermined minimum value Min_v and a minimum selector unit 1527 disposed to force the filtered envelope signal 1523 to be at most a predetermined maximum value Max_V.

A maximum selector unit and a minimum selector unit can be located in various ways with respect to the non-linear filter. For example, a transmitter according to a first alternative embodiment of the invention comprises a minimum selector unit before the non-linear filter in the direction of information propagation and a maximum selector unit after the non-linear filter, a transmitter according to a second alternative embodiment of the invention comprises both a minimum selector unit and a maximum selector unit before the non-linear filter, and a transmitter according to a third alternative embodiment of the invention comprises both a minimum selector unit and a maximum selector unit after the non-linear filter.

A transmitter according to an embodiment of the invention comprises a digital low-pass filter 1529 disposed to limit a spectrum of the filtered envelope signal 1523 in to a range suitable for the controllable supply unit 1524.

In a transmitter according to an embodiment of the invention the non-linear filter 1522 is disposed to have a first transfer function when the envelope signal is greater than the filtered envelope signal and a second transfer function when the envelope signal is smaller than the filtered envelope signal.

In a transmitter according to an embodiment of the invention the non-linear filter 1522 comprises a delay element disposed to form a delayed envelope signal and a maximum selection unit disposed to form the filtered envelope signal as a maximum of the delayed envelope signal and the envelope signal.

A transmitter according to an embodiment of the invention comprises an adjustable delay unit 1530 disposed to produce a delay on a signal path from signal outputs of the channel filters 1504 and 1505 to a control input of the controllable supply unit 1524. Delay adjustment between the envelope of the input signal 1518 of the amplifier stage and a waveform of the supply voltage Vs can be performed with the adjustable delay units 1506, 1507, and 1530.

Figure 11:
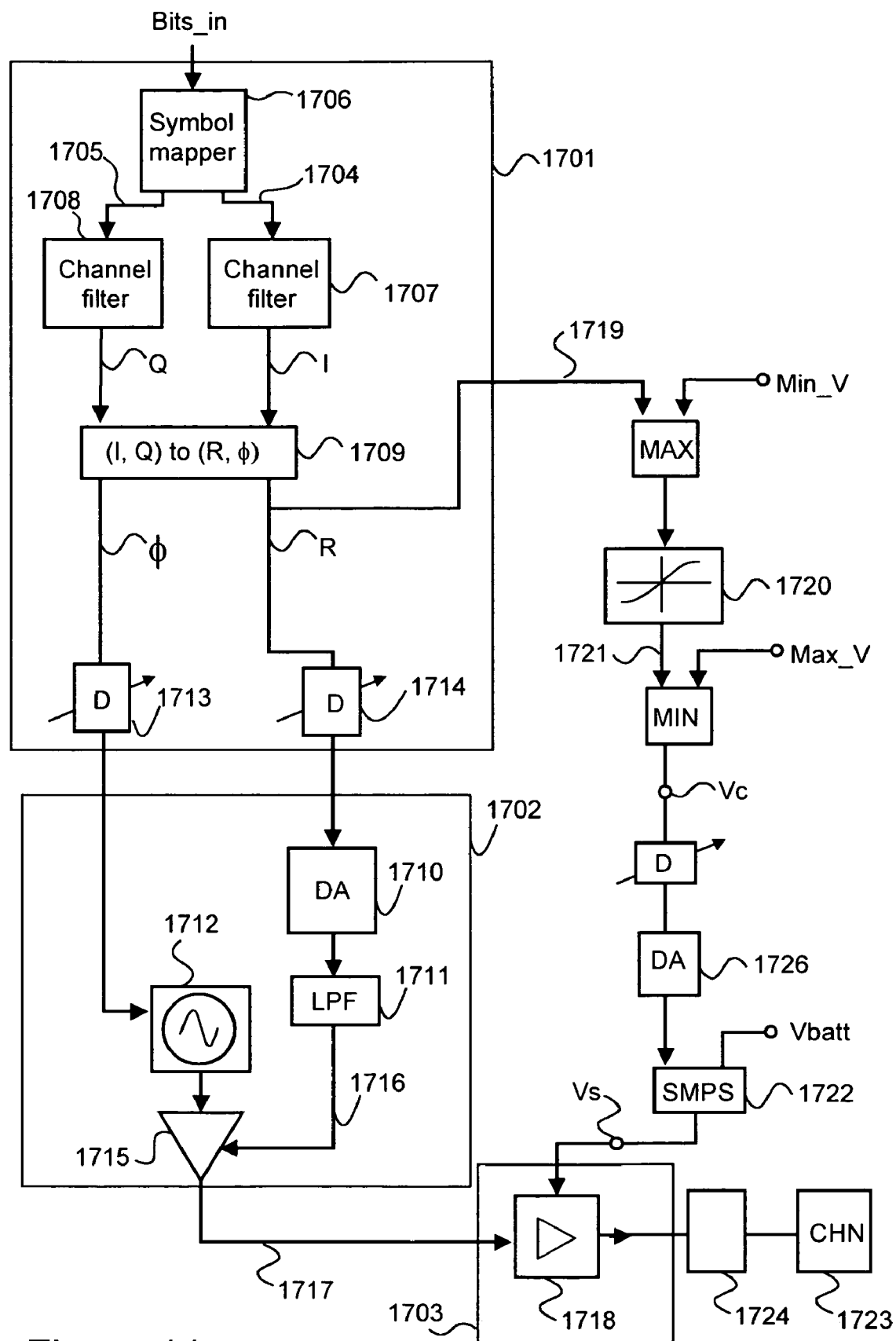
FIG. 11 shows a transmitter according to an embodiment of the invention.

FIG. 11 shows a transmitter according to an embodiment of the invention. The transmitter comprises a base band stage 1701, an up-modulator 1702, and a power amplifier 1703. Incoming bits Bits_in are mapped into symbols having an X-component 1704 and a Y-component 1705 with a bits-to-symbol mapper 1706. The X- and Y-components of the symbols are filtered with digital channel filters 1707 and 1708, respectively. Output signals of the digital channel filters 1707 and 1708 are a digital base band in-phase signal I and a digital base band quadrature signal Q, respectively. The digital base band in-phase and quadrature signals I and Q are converted into a polar form with a Cartesian-to-polar converter 1709. Output signals of the Cartesian-to-polar converter 1709 are a digital amplitude information signal R and a digital phase information signal $\phi$. A mutual delay difference between the digital amplitude and phase information signals R and $\phi$ can be adjusted with adjustable delay units 1713 and 1714. The digital amplitude and phase information signals R and $\phi$ are input signals for the up-modulator 1702. The up-modulator 1702 is a polar modulator that comprises a phase modulator 1712 and a variable gain unit 1715. An instantaneous phase of an output signal of the phase modulator 1712 is proportional to the digital phase information signal $\phi$. The phase modulator 1712 can be a phase modulator device according to prior art. For example, the phase modulator 1712 can be based on a time-differentiator that converts the digital phase information signal $\phi$ into digital frequency information signal and on a frequency multiplier loop having a fractional divider in its feedback path, the fractional divider being controlled with the digital frequency information signal with the aid of delta-sigma modulation. The output signal of the phase modulator is an input signal of the variable gain unit 1715. The up-modulator 1702 comprises a digital-to-analog converter 1710 that is disposed to convert the digital amplitude information signal R into analog form. Analog low-pass filter 1711 is disposed to attenuate image spectra around multiples of a sample rate of the digital amplitude information signal R. An output signal of the low-pass filter 1711 is an analog amplitude information signal 1716. An instantaneous gain produced with the variable gain unit 1715 is proportional to the analog amplitude information signal 1716. Therefore, an envelope of an output signal of the up-modulator is also proportional to the analog amplitude information signal 1716. The output signal of the up-modulator 1702 is an input signal 1717 of an amplifier stage 1718 of the power amplifier 1703.

The digital amplitude information signal R is proportional to an envelope of the input signal 1717 of the amplifier stage 1718. Therefore, the digital amplitude information signal R is used as an envelope signal 1719. In this embodiment of the invention the Cartesian-to-polar converter 1709 acts also as an envelope detector. Actually, in the Cartesian-to-polar converter 1709, the digital amplitude information signal R is calculated as $\sqrt{I^2+Q^2}$, where I and Q are the digital base band in-phase and quadrature signals, respectively.

The envelope signal 1719 is filtered with a digital non-linear filter 1720 that produces a digital filtered envelope signal 1721. The non-linear filter 1720 is disposed to filter the envelope signal 1719 so that a rise time of a peak in a waveform of the envelope signal is substantially preserved and a temporal duration of said peak is lengthened. The digital non-linear filter 1720 can be a digital non-linear filter shown in FIG. 6a, 6b, or 6c.

The digital filtered envelope signal 1721 is substantially used as a control value Vc that controls a controllable supply unit 1722. The controllable supply unit produces a supply voltage Vs for the amplifier stage 1718. An output signal of the amplifier stage is coupled to the channel 1723 via a channel front-end circuit 1724. Depending on a type of the controllable supply unit 1722 the control value Vc may have to be converted into analog form with a digital-to-analog converter 1726.

In the transmitters shown in FIGS. 10 and 11 an envelope signal that represents an envelope of an input signal of an amplifier stage is detected from a base band signal. In the transmitters shown in FIGS. 10 and 11 the base band signal is a complex valued quantity having an in-phase component I and a quadrature component Q. From the viewpoint of the principle of the present invention it is immaterial wherefrom the envelope signal is detected since the envelope of the input signal of the amplifier stage, i.e an envelope of an up-modulated RF-signal (Radio Frequency), is substantially same as the envelope of the base band signal. Advantages of detecting the envelope signal from the base band signal are associated with implementation issues. Detection of the envelope signal from the base band signal is significantly easier and more cost effective to realize than detection of the envelope signal from the input signal of the amplifier stage because the frequency band of the input signal of the amplifier stage is significantly higher than that of the base band signal. Furthermore, in certain cases there is no need for a separate envelope detector when the envelope signal is detected from the base band signal. This is a case in the transmitter shown in FIG. 11 wherein the amplitude information signal R is actually the envelope signal.

Figure 12:
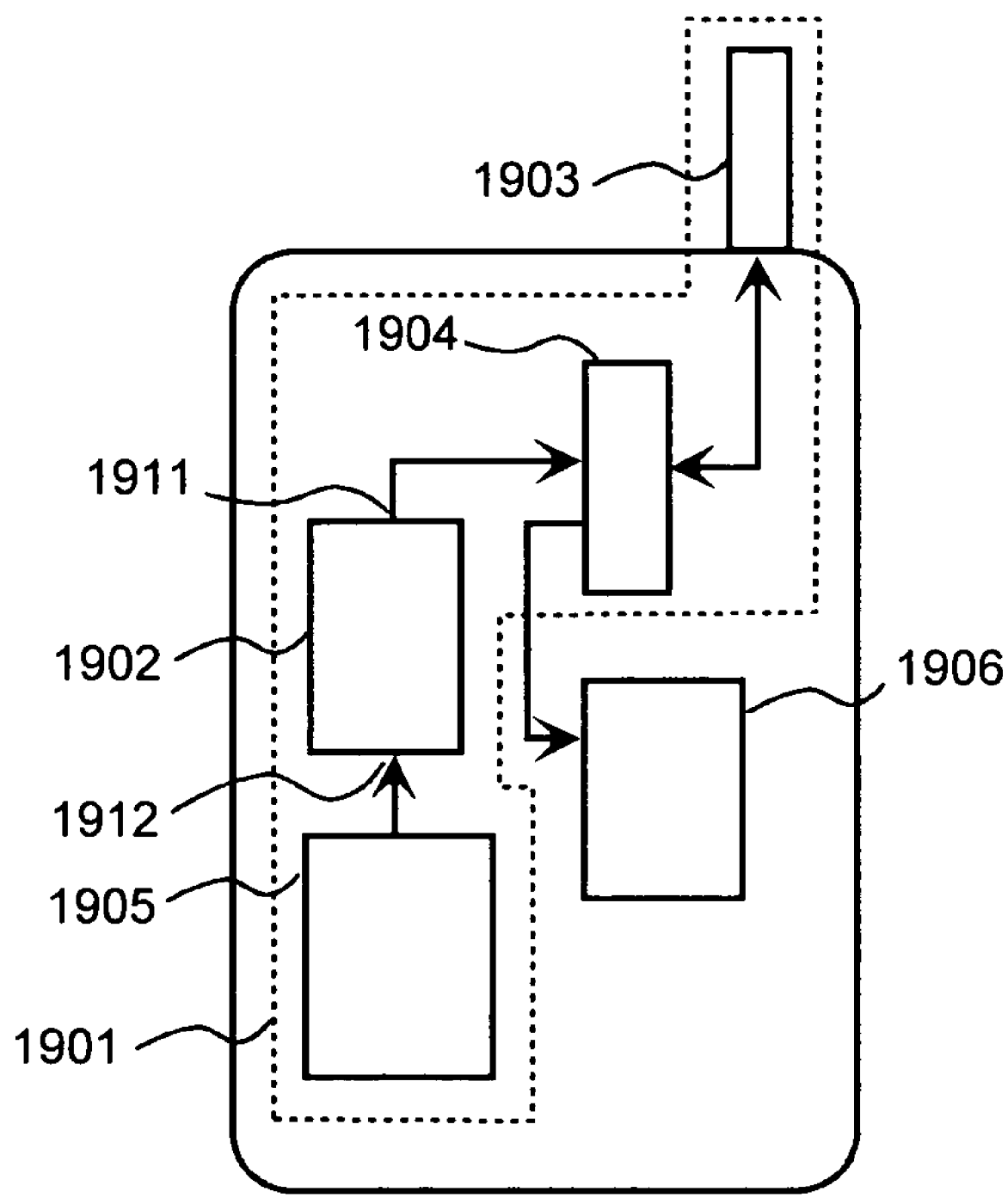
FIG. 12 shows a mobile communication device according to an embodiment of the invention.

FIG. 12 shows a mobile communication device according to an embodiment of the invention. A transmitter 1901 of the mobile communication device comprises an envelope tracking power amplifier 1902 that comprises an amplifier stage, an envelope detector disposed to produce an envelope signal that represents an envelope of an input signal of the envelope tracking power amplifier, a non-linear filter disposed to produce a filtered envelope signal by filtering the envelope signal so that a rise time of a peak in a waveform of the envelope signal is substantially preserved and a temporal duration of said peak is lengthened, and a controllable supply unit disposed to determine a value of a supply voltage at least partly according to said filtered envelope signal and to produce the supply voltage for energizing the amplifier stage. A signal output interface 1911 of the envelope tracking power amplifier 1902 is coupled to an antenna 1903 via a duplexer and antenna front-end element 1904. A block 1905 represents all the parts of the mobile communication device that provides an RF-input signal (Radio Frequency) to a signal input interface 1912 of the envelope tracking power amplifier 1902, e.g. a microphone, an analogue-to-digital converter, a codec, an up-modulator, etc. A block 1906 represents all the parts of the mobile communication device that process a signal received from the antenna 1903 via the duplexer and antenna front-end element 1904, e.g. a demodulator, equalizers, filtering systems, controllers, a speaker, etc.

Furthermore, the mobile communication device may comprise a controllable gain unit that compensates undesirable variations in a gain of the envelope tracking power amplifier 1902 caused by changes in an operating point of an output stage transistor of the amplifier stage when the supply voltage changes. The controllable gain unit can be located in the block 1905. In the mobile communication device it is possible to amplify or attenuate a base band signal with the controllable gain unit, i.e. before up-modulation. In this case the controllable gain unit does not have to be able to handle radio frequency (RF) signals. In certain mobile communication devices according to an embodiment of the invention a base band signal is available also in a digital form. In this kind of case the compensation can be performed with digital signal processing means.

In a mobile communication device according to an embodiment of the invention the envelope signal is detected from a base band signal that is present in a base band stage of the transmitter 1901 of the mobile communication device. Detecting the envelope signal form the base band signal is described above with the aid of FIGS. 10 and 11.

In a mobile communication device according to an embodiment of the invention the non-linear filter is disposed to have a first transfer function when the envelope signal is greater than the filtered envelope signal and a second transfer function when the envelope signal is smaller than the filtered envelope signal.

In a mobile communication device according to an embodiment of the invention the non-linear filter comprises a delay element disposed to form a delayed envelope signal and a maximum selection unit disposed to form the filtered envelope signal as a maximum of the delayed envelope signal and the envelope signal.

A mobile communication device according to an embodiment of the invention is a mobile phone.

It will be evident to any person skilled in the art that the invention and its embodiments are thus not limited to the above-described examples, but may vary within the scope of the independent claims. For example, in many applications there can be either an analog implementation or a digital implementation or a combination of those. An analog implementation is possible e.g. for copper cable modems and for low frequency (LF) radios in which signal frequencies are not so high as e.g. in mobile phones. Furthermore, from the viewpoint of the principle of the present invention it is immaterial whether an envelope is detected from an input signal of an amplifier stage of an envelope tracking power amplifier or from some other signal from which information associated with the envelope can be extracted, e.g. from a base band signal.

While there have been shown and described and pointed out fundamental novel features of the invention as applied to preferred embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. An envelope tracking power amplifier having an amplifier stage, comprising:
    an envelope detector disposed to produce an envelope signal, said envelope signal representing an envelope of an input signal of the envelope tracking power amplifier,
    a non-linear filter disposed to filter the envelope signal so that a rise time of a peak in a waveform of the envelope signal is substantially preserved and a temporal duration of said peak is lengthened, said filter producing a filtered envelope signal, and
    a controllable supply unit disposed to determine a value of a supply voltage at least partly according to said filtered envelope signal and to produce the supply voltage for energizing the amplifier stage.

2. An envelope tracking power amplifier according to claim 1, wherein said non-linear filter is disposed to have a first transfer function when the envelope signal is greater than the filtered envelope signal and a second transfer function when the envelope signal is smaller than the filtered envelope signal.

3. An envelope tracking power amplifier according to claim 1, wherein said non-linear filter comprises a delay element disposed to form a delayed envelope signal and a maximum selection unit disposed to form the filtered envelope signal as a maximum of the delayed envelope signal and the envelope signal.

4. An envelope tracking power amplifier according to claim 1, wherein the controllable supply unit comprises a switched mode power supply (SMPS) disposed to produce the supply voltage for energizing the amplifier stage.

5. An envelope tracking power amplifier according to claim 1, comprising a maximum selector unit disposed to force the envelope signal to be at least a predetermined minimum value and a minimum selector unit disposed to force the filtered envelope signal to be at most a predetermined maximum value.

6. A mobile communication device comprising:
    an envelope tracking power amplifier having an amplifier stage,
    an envelope detector disposed to produce an envelope signal, said envelope signal representing an envelope of an input signal of the envelope tracking power amplifier,
    a non-linear filter disposed to filter the envelope signal so that a rise time of a peak in a waveform of the envelope signal is substantially preserved and a temporal duration of said peak is lengthened, said filter producing a filtered envelope signal, and
    a controllable supply unit disposed to determine a value of a supply voltage at least partly according to said filtered envelope signal and to produce the supply voltage for energizing the amplifier stage.

7. A mobile communication device according to claim 6, wherein said non-linear filter is disposed to have a first transfer function when the envelope signal is greater than the filtered envelope signal and a second transfer function when the envelope signal is smaller than the filtered envelope signal.

8. A mobile communication device according to claim 6, wherein said non-linear filter comprises a delay element disposed to form a delayed envelope signal and a maximum selection unit disposed to form the filtered envelope signal as a maximum of the delayed envelope signal and the envelope signal.

9. A mobile communication device according to claim 6, comprising a controllable gain unit disposed to at least partly compensate a change in a gain of the envelope tracking power amplifier, the change in the gain being caused by a change in an operating point of an output stage transistor of said envelope tracking power amplifier.

10. A mobile communication device according to claim 6, wherein the mobile communication device is a mobile phone.

11. A mobile communication device according to claim 6, wherein the envelope detector is disposed to detect the envelope signal from a base band signal that is present in a base band stage of a transmitter of the mobile communication device.

12. A method for optimizing efficiency of an envelope tracking power amplifier having an amplifier stage, the method comprising:
    detecting an envelope signal that represents an envelope of an input signal of the envelope tracking power amplifier,
    producing a filtered envelope signal by filtering the envelope signal with a non-linear filter that substantially preserves a rise time of a peak in a waveform of the envelope signal and lengthens a temporal duration of said peak,
    determining a supply voltage value at least partly according to said filtered envelope signal, and
    setting a supply voltage of the amplifier stage to be the supply voltage value.

13. A method according to claim 12, wherein said detecting the envelope signal comprises forcing the envelope signal to be at least a predetermined minimum value and said producing the filtered envelope signal comprises forcing the filtered envelope signal to be at most a predetermined maximum value.

14. A method according to claim 12, wherein said producing the filtered envelope signal is performed by using a first transfer function when the envelope signal is greater than the filtered envelope signal and a second transfer function when the envelope signal is smaller than the filtered envelope signal.

15. A method according to claim 12, wherein said producing the filtered envelope signal is performed by using a delay element that forms a delayed envelope signal and a maximum selection unit that forms the filtered envelope signal as a maximum of the delayed envelope signal and the envelope signal.

16. A transmitter comprising:
a base band stage disposed to produce a base band signal and an up-modulator disposed to up-modulate the base band signal,
a power amplifier having an amplifier stage, an input signal of the amplifier stage being substantially an output signal of the up-modulator,
an envelope detector disposed to detect from the base band signal an envelope signal that represents an envelope of the input signal of the amplifier stage,
a non-linear filter disposed to filter the envelope signal so that a rise time of a peak in a waveform of the envelope signal is substantially preserved and a temporal duration of said peak is lengthened, said filter producing a filtered envelope signal, and
a controllable supply unit disposed to determine a value of a supply voltage at least partly according to said filtered envelope signal and to produce the supply voltage for energizing the amplifier stage.

17. A transmitter according to claim 16, wherein said up-modulator is a quadrature amplitude modulator (QAM) and said envelope detector is a signal processing entity disposed to form a value of said envelop signal according to an in-phase component of the base band signal and a quadrature component of the base band signal.

18. A transmitter according to claim 17, wherein said envelope detector is disposed to form said value of said envelope signal as $\sqrt{I^2+Q^2}$, where I is the in-phase component of the base band signal and Q is the quadrature component of the base band signal.

19. A transmitter according to claim 16, wherein said up-modulator is a polar modulator and a Cartersian-to-polar converter is disposed to act as said envelope detector.

20. A transmitter according to claim 16, wherein said non-linear filter is disposed to have a first transfer function when the envelope signal is greater than the filtered envelope signal and a second transfer function when the envelope signal is smaller than the filtered envelope signal.

21. A transmitter according to claim 16, wherein said non-linear filter comprises a delay element disposed to form a delayed envelope signal and a maximum selection unit disposed to form the filtered envelope signal as a maximum of the delayed envelope signal and the envelope signal.

22. A transmitter according to claim 16, comprising a maximum selector unit disposed to force the envelope signal to be at least a predetermined minimum value and a minimum selector unit disposed to force the filtered envelope signal to be at most a predetermined maximum value.

* * * * *